US007868392B2

(12) United States Patent
Tailliet

(10) Patent No.: US 7,868,392 B2

(45) Date of Patent: Jan. 11, 2011

(54) INTEGRATED CIRCUIT TOLERANT TO THE LOCKING PHENOMENON

(75) Inventor: Francois Tailliet, Fuveau (FR)

(73) Assignee: STMicroelectronics S.A., Montrouge (FR)

( * ) Notice: Subject to any disclaimer, the term of this patent is extended or adjusted under 35 U.S.C. 154(b) by 809 days.

(21) Appl. No.: 11/172,609

(22) Filed: Jun. 30, 2005

(65) Prior Publication Data

US 2006/0081938 A1 Apr. 20, 2006

(30) Foreign Application Priority Data

Jul. 1, 2004 (FR) .................................. 04 07309

(51) Int. Cl.
*H01L 29/76* (2006.01)

(52) U.S. Cl. ............................. 257/371; 257/E27.046; 257/E27.063; 438/223

(58) Field of Classification Search ................. 257/371, 257/E21.632, E27.063, E27.046, 355, 357
See application file for complete search history.

(56) References Cited

U.S. PATENT DOCUMENTS

| | | | | |
|---|---|---|---|---|
| 4,441,035 | A * | 4/1984 | Demetriou | 327/546 |
| 4,672,584 | A * | 6/1987 | Tsuji et al. | 365/226 |
| 4,881,107 | A * | 11/1989 | Matsushita | 257/338 |
| 5,589,786 | A * | 12/1996 | Bella et al. | 327/108 |
| 5,721,445 | A * | 2/1998 | Singh et al. | 257/369 |
| 6,222,254 | B1 * | 4/2001 | Liang et al. | 257/622 |
| 6,466,077 | B1 * | 10/2002 | Miyazaki et al. | 327/534 |
| 6,642,588 | B1 * | 11/2003 | Porter et al. | 257/393 |
| 6,847,512 | B2 * | 1/2005 | Kitano | 361/56 |
| 2002/0033510 | A1 | 3/2002 | Tomita | |

FOREIGN PATENT DOCUMENTS

| | | |
|---|---|---|
| JP | 60111454 | 6/1985 |

OTHER PUBLICATIONS

French Preliminary Search Report dated Apr. 22, 2005 for French Application No. 04 07309.

* cited by examiner

*Primary Examiner*—Wael M Fahmy
*Assistant Examiner*—Sarah K Salerno
(74) *Attorney, Agent, or Firm*—Lisa K. Jorgenson; Stephen Bongini; Fleit Gibbons Gutman Bongini & Bianco P.L.

(57) ABSTRACT

Integrated circuit comprising doped zones (3 to 8) formed in a substrate (1, 2), forming a parasitic thyristor structure with two parasitic bipolar transistors ($T_1$, $T_2$), the integrated circuit comprising two metallizations (16, 19) interconnecting each of the two corresponding doped zones (4, 5; 6, 7) of the integrated circuit, to reduce the base resistances ($R_{P-}$, $R_{P-}$) of the two bipolar transistors, at least one of the metallizations (16, 19) performed to reduce the base resistances ($R_{N-}$, $R_{P-}$) of the two bipolar transistors, being connected to a power supply metallization (15, 16) in the integrated circuit, entirely through the substrate (1, 2).

20 Claims, 3 Drawing Sheets

INTEGRATED CIRCUIT TOLERANT TO THE LOCKING PHENOMENON

FIELD OF THE INVENTION

This invention relates to an integrated circuit tolerant to the latch-up phenomenon.

It is specifically but not exclusively applicable to CMOS (Complementary Metal-Oxide Semiconductor) type integrated circuits that are particularly sensitive to this phenomenon.

BACKGROUND OF THE INVENTION

The latch-up phenomenon creates an inrush current related to the triggering of a parasitic thyristor structure inherent to some integrated circuit technologies, and particularly CMOS type technologies.

In addition to MOS active transistors, there are several parasitic bipolar transistors in the circuit for which the gain may be very high (50 to 100). Therefore, they do not create a nuisance for operation of the circuit, except in some parasitic thyristor type configurations (PNPN) in which two parasitic bipolar transistors work in positive inverse feedback, forming a bistable configuration that can be triggered by small disturbances. Once the inverse feedback has been set up, the thyristor is in a strongly on-state that is self-powered even after the disturbance has disappeared, and can be destructive for the circuit.

This type of parasitic thyristor configuration is illustrated in FIG. 1 that shows a section view through the structure of a cell in an integrated CMOS circuit, for example including a logical gate such as an inverter, and FIG. 2 shows the equivalent connection circuit of the parasitic thyristor.

The cell in the CMOS circuit shown on FIG. 1 of the type with a P substrate and an N well comprises two P and N MOS transistors, made in a P− doped semiconducting substrate 1, the P MOS transistor being formed in an N− doped region 2 (well) of the substrate including two P+ doped regions 3, 4 delimiting the channel of the P MOS transistor, the first being connected to the power supply terminal Vdd and the second to the circuit output, and an N+ doped region 5 also connected to the terminal Vdd and being connected to the power supply polarization. The N MOS transistor is composed of two N+ doped regions 7, 8 delimiting a channel formed in the substrate 1, one being connected to the ground terminal Vss and the other to the output of the circuit, and of a P+ doped region 6 at the output from the circuit also connected to the terminal Vss and to which the ground polarization is connected.

The gates of these transistors are composed of polysilicon layers 9 connected to the input of the circuit and formed at a distance from and facing the n and p channels of the two transistors.

FIG. 1 also shows the layout of the parasitic thyristor with respect to the doped regions forming the two MOS transistors. As illustrated in FIGS. 1 and 2, the parasitic thyristor is formed by two bipolar transistors, one pnp type transistor $T_1$ and one npn type transistor $T_2$ mounted head-foot, the collector of one being connected to the base of the other, while the emitters of these two transistors are connected to the Vdd and Vss terminals of the circuit respectively. The emitter-base junction of transistor $T_1$ is formed by the association of the P+ doped region 4 and N− doped region 2, while the collector-base junction of this transistor is formed by the association of the P− doped substrate 1 and the N− doped region 2. Therefore the emitter and the base of transistor $T_1$ are connected to the Vdd terminal of the circuit, the emitter being connected directly and the base being connected through a resistance $R_{N-}$ representing the resistance of the well 2. The base-emitter junction of the transistor $T_2$ is formed by the association of the substrate 1 and the N+ doped region 7 connected to the Vss terminal of the circuit, while the base-collector junction of this transistor is formed by the association of the substrate 1 and the region 2. Therefore the base and the emitter of the transistor $T_2$ are connected to the Vss terminal of the circuit, the base being connected directly and the emitter being connected through a resistance $R_{P-}$ representing the resistance of the substrate 1.

The parasitic thyristor can be triggered by an overvoltage on the circuit power supply, a current injection on an input or output pin of the integrated circuit, or by radiation of particles. This triggering produces a strong inrush current between the power supply pins of the integrated circuit that usually causes destruction of the circuit.

The sensitivity of an integrated circuit to the latch-on phenomenon can be measured by injecting a current into an input or output pin of the integrated circuit when the circuit is powered normally, by detecting a current overconsumption on the power supply that may be more or less sudden, and by measuring the intensity of the injected current to the appearance of the overconsumption. If the detected overconsumption ceases with the current injection, the latch-on phenomenon is said to be temporary. However, if the overconsumption remains even after the current injection has stopped, the latch-on phenomenon is said to be permanent. A circuit is considered to be only slightly sensitive to this phenomenon if it is only temporary or if the permanent latch-on phenomenon only appears with an injected current with a high intensity (typically more than 100 mA for a CMOS circuit).

There are several techniques for reducing the sensitivity of components to the locking phenomenon.

A first technique consists of using in-depth epitaxied substrates (in other words strongly doped substrates) so as to reduce the base resistance of one of the two transistors, and in this case the base resistance $R_{P-}$ of transistor $T_2$ forming the parasitic thyristor. The base resistance of the transistors T1, T2 can also be reduced using strongly doped wells made in-depth in the substrate. FIG. 3 shows a sectional view through the structure of a CMOS integrated circuit and illustrates the epitaxied substrate technique used to obtain in-depth layers 11, 12 with low resistivity.

These techniques are expensive to implement because they require that a large number (between 5 and 10) of component manufacturing masks should be modified.

Particular routing rules have also been implemented to reduce the sensitivity of components to the latch-on phenomenon, to reduce the values of the base resistances $R_{N-}$ and $R_{P-}$ of the two transistors $T_1$ and $T_2$. This technique is illustrated on FIG. 4 that shows a top view of the CMOS circuit shown on FIG. 1. On FIG. 4, the circuit comprises metallization lines 15, 17 and 18 that also transport the voltage Vdd, the input signal and the voltage Vss respectively, and a metallization segment 10 connecting the drains (regions 4 and 7) of the two MOS transistors. The lines 15 and 18 each comprise an arm 16, 19 designed to carry the voltage Vdd to the polarization region 5, and the voltage Vss to the polarization region 6. The input metallization line 17 is connected to the polysilicon line 9 forming the transistors gate.

The arms 16 and 19 are also connected to regions 4 and 7 respectively forming the sources of the MOS transistors that are also connected to potentials Vdd and Vss respectively, and firstly regions 4 and 5, and secondly regions 6 and 7 are arranged as close as possible to each other, to reduce the values of the base resistances $R_{N-}$ and $R_{P-}$ of the two transistors $T_1$ and $T_2$. These arrangements reduce the base resistances $R_{N-}$ and $R_{P-}$, to a few tens or a few hundreds of ohms.

However, these routing rules are not infallible, and even if the well and substrate connections are correctly positioned, current levels injected during the latch-on test (typically 100 mA) are sometimes sufficient to reach the polarization voltage (0.6 V) of the emitter-base junctions of the parasitic thyristor directly. This voltage can sometimes be reached with resistances of a few hundred ohms with a substrate current of a few mA.

SUMMARY OF THE INVENTION

The purpose of this invention is to overcome these disadvantages. This objective is achieved by providing an integrated circuit comprising doped zones formed in a substrate, forming a parasitic thyristor structure with two parasitic bipolar transistors, the integrated circuit comprising two metallizations interconnecting each of the two corresponding doped zones of the integrated circuit, to reduce the base resistances of the two bipolar transistors.

According to the invention, at least one of the metallizations performed to reduce the base resistances of the two bipolar transistors is connected to a power supply metallization in the integrated circuit, entirely through the substrate.

According to one preferred embodiment of the invention, the two metallizations performed to reduce the base resistances of the two bipolar transistors are connected to a corresponding power supply metallization through the substrate of the integrated circuit.

According to another preferred embodiment of the invention, the two doped zones interconnected through the two metallizations to reduce the base resistances of the two bipolar transistors, are placed as close as possible to each other.

According to another preferred embodiment of the invention, this integrated circuit comprises two MOS transistors with different channel types, one made in a substrate and the other made in a well formed in the substrate with a different doping, each MOS transistor forming a bipolar transistor of the parasitic thyristor structure.

In another preferred embodiment of the invention, this integrated circuit comprises several parasitic thyristors, the metallizations reducing the base resistances of at least one of the two bipolar transistors of at least some of the parasitic thyristors, being interconnected by a metallization.

According to another preferred embodiment of the invention, this integrated circuit comprises several parasitic thyristors, the metallizations reducing the base resistances of the two bipolar transistors of at least some of the parasitic thyristors, interconnected by two corresponding metallizations.

BRIEF DESCRIPTION OF THE DRAWINGS

A preferred embodiment of the invention will be described below as a non-limiting example with reference to the attached drawings in which.

DETAILED DESCRIPTION OF PREFERRED EMBODIMENTS

Figure 1:
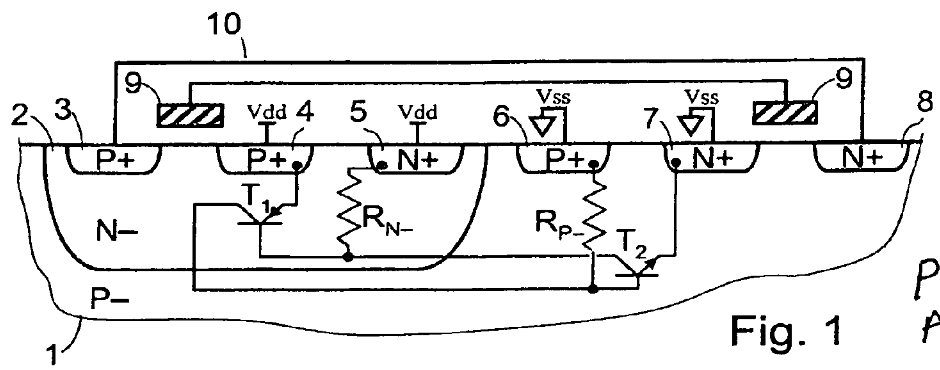
FIG. 1 diagrammatically shows a cross-section through a cell of a CMOS integrated circuit with two N and P MOS transistors according to prior art, and the connection configuration of the parasitic thyristor used in this circuit.
Figure 5:
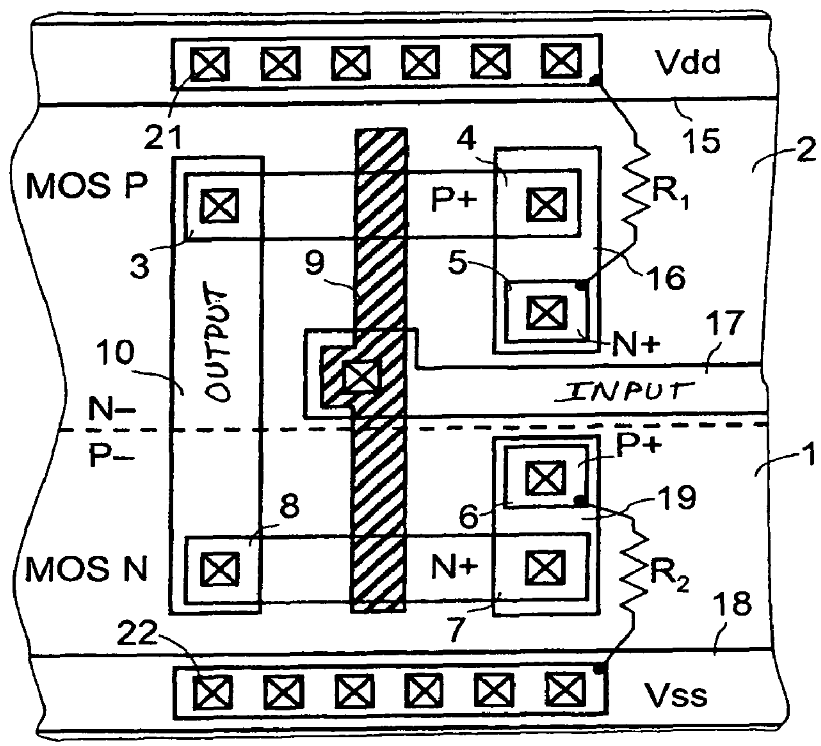
FIG. 5 shows a top view of an integrated circuit cell of the type shown on FIG. 1, in which a technique according to the invention has been used to reduce the sensitivity of the circuit to the latch-on phenomenon

FIG. 5 shows a CMOS circuit cell of the type shown on FIG. 1, in other words with a P substrate and an N well. This circuit comprises two P and N MOS transistors made in a P− doped semiconducting substrate 1, the P MOS transistor being formed in an N− doped region 2 (well) of the substrate. This circuit is powered through two metallization lines 15, 18, on which the voltages Vdd and Vss respectively will be applied. This figure also shows several connection points 21, 22 of the power supply metallization lines 15 or 18 to the well 2 and to the substrate 1.

The P MOS transistor comprises two P+ doped regions 3, 4 delimiting its channel, these two regions being formed in the well 2. The region 4 is connected to a metallization line 10 transporting the circuit output signal.

The N MOS transistor comprises two N+ doped regions 7, 8 delimiting its channel, these two regions being formed in the substrate 1. The region 8 is connected to a metallization line 10 transporting the circuit output signal.

It is also planned to use an N+ doped region 5 formed in the well 2, to apply the polarization voltage Vdd to it, and a P+ doped region 6 made in the substrate 1 to apply the polarization voltage Vss to it, this arrangement reducing the sensitivity of the circuit to the latch-on phenomenon.

Advantageously, firstly the regions 4 and 5, and secondly the regions 6 and 7, are placed as close to each other as possible and are coupled to the same metallization segments 16 and 19 respectively so as to reduce the base resistances $R_{N-}$ and $R_{P-}$ respectively of the two transistors $T_1$ and $T_2$ forming the parasitic thyristor.

This circuit also includes an input metallization line 17 connected to a polysilicon line 9 forming the gates of the P and N MOS transistors.

Figure 4:
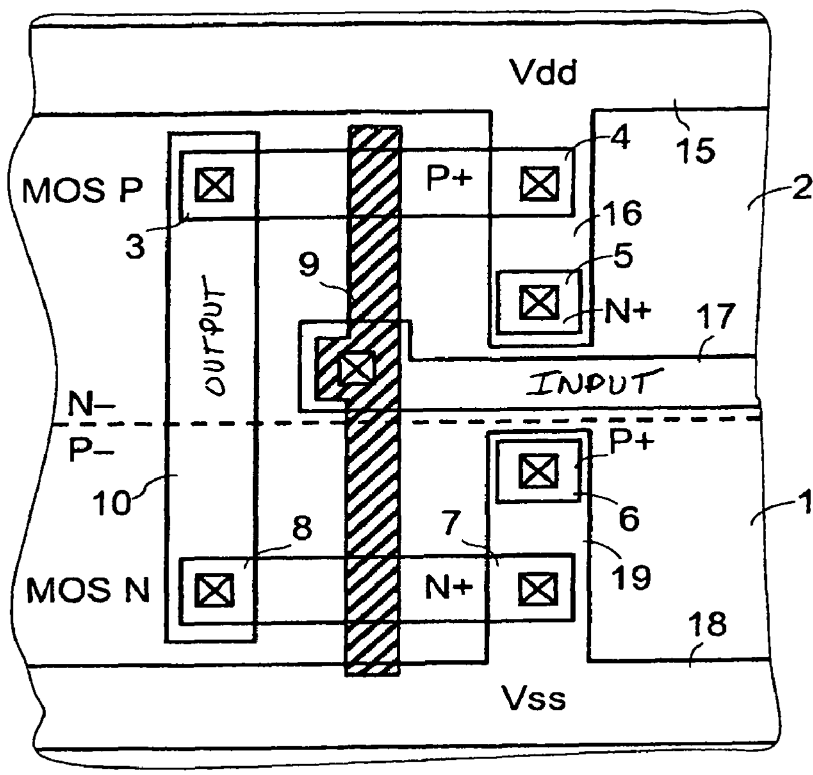
FIG. 4 shows a top view of a cell of a circuit of the type shown on FIG. 1, in which another technique according to prior art has been used to reduce the sensitivity of the circuit to the latch-on phenomenon.

According to the invention, unlike the circuit shown on FIG. 4, the metallization segment 16 is not connected to the metallization line 15 carrying the voltage Vdd, and/or the metallization segment 19 is not connected to the metallization line 18 carrying the voltage Vss. In this way, the voltage Vdd and/or the voltage Vss is transmitted to the metallization segments 16 and/or 19 through connections of the well 2, and/or to substrate 1 respectively, these connections having so-called access resistances R1 and R2 respectively as shown symbolically on FIG. 5.

Figure 2:
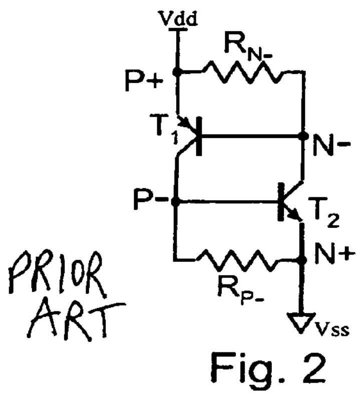
FIG. 2 shows the equivalent circuit of the parasitic thyristor used in the circuit represented on FIG. 1.
Figure 6:
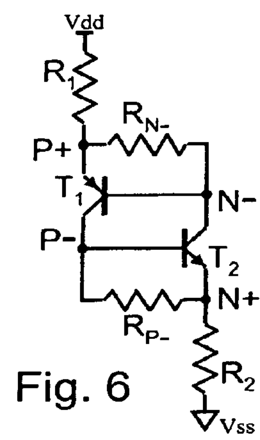
FIG. 6 shows the equivalent circuit of the parasitic thyristor used in the circuit shown in FIG. 5.
Figure 3:
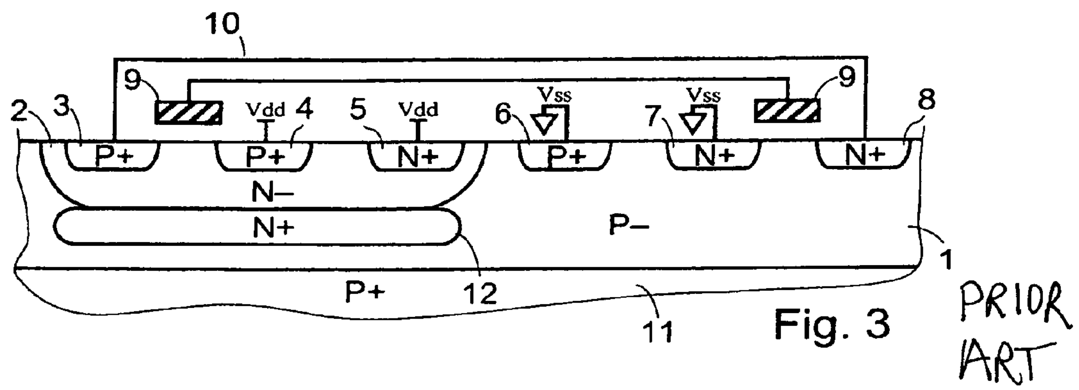
FIG. 3 diagrammatically shows a cross-section through a cell of a CMOS type circuit of the type shown in FIG. 1, in which techniques according to prior art are used to reduce the sensitivity of the circuit to the latch-on phenomenon.

The circuit equivalent to the parasitic thyristor thus obtained is shown on FIG. 6. The difference between this circuit and the circuit shown on FIG. 2 is that this circuit comprises one or both of the two resistances $R_1$ and $R_2$ connecting the junction point between the emitter of the parasitic bipolar transistor $T_1$ and $T_2$ respectively and the base resistance $R_{N-}$ and $R_{P-}$ respectively, to the power supply source Vdd and Vss respectively.

The access resistances $R_1$ and $R_2$ between the power supply voltages Vdd and Vss and the sources of the N and P MOS transistors prevent the transfer of a high current between the emitter and the base of the parasitic transistors $T_1$ and $T_2$.

Typically, the resistances $R_1$ and $R_2$ are equal to 1 kohm. If the circuit is powered at 5 volts, the latch-on current (if any) (passing through the parasitic thyristor) is limited to 5/(1000+1000)=2.5 mA. Since the emitter–base junctions of the parasitic bipolar transistors T1 and T2 are short circuited, the thyristor latch-on holding current is high (conventionally more than 2.5 mA). The result is that the permanent latch-on phenomenon is eliminated.

Obviously, the resistances $R_1$ and $R_2$ have an influence on normal operation of the circuit, to the extent that they act in series on the resistance of the N and P MOS transistors when in the on-state. However, the effect of these resistances is negligible if conventional logic gates are not required to supply power and if there is no particular constraint on the switching rate.

For example, for a 5 V, 0.6 μm CMOS technology, the resistance Ron of a logic gate of MOS transistors in the on-state is of the order of 5 kohms. Therefore the addition of 1 kohm in series will not have much effect. If this effect causes a problem, all that will be necessary to compensate for it is to increase the width/length (W/L) ratio of the MOS transistor channels by 20%.

The invention is useful particularly in areas close to circuit connection pins where current densities injected into the substrate and the wells are highest. Injected current densities are generally highest close to the pins due to protections against ElectroStatic Discharge (ESD) that are connected to the pins and that comprise at least one diode as injecting element.

The invention can be applied not only when making a set of masks for a new component, but also to correct an existing component sensitive to the latch-on phenomenon. The cost of such a correction is minor since all that is necessary is to modify a single metallization mask related to an upper layer of the component, while solutions according to prior art require that 5 to 10 masks related more particularly to lower layers of the component need to be modified.

Figure 7:
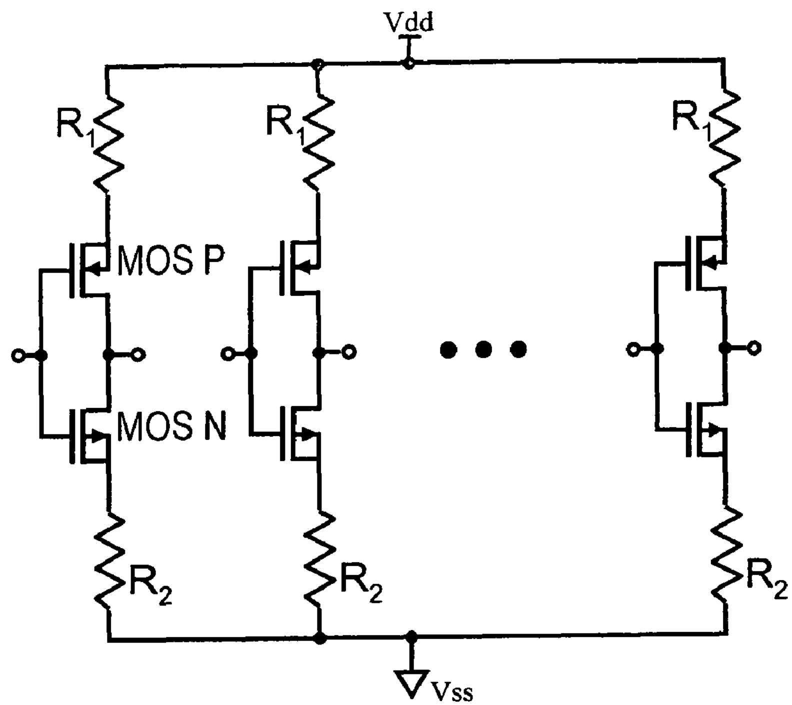
FIGS. 7 and 8 each show a variant embodiment of a component integrating several logical gates, modified according to the invention.

In the above description, the invention was applied to a single logic gate. If the component comprises several logic gates, each logic gate can be modified according to the above description by separating branches 16 and 19 of the power supply lines 15 and 18. FIG. 7 shows the equivalent electronic diagram of the component.

Figure 8:
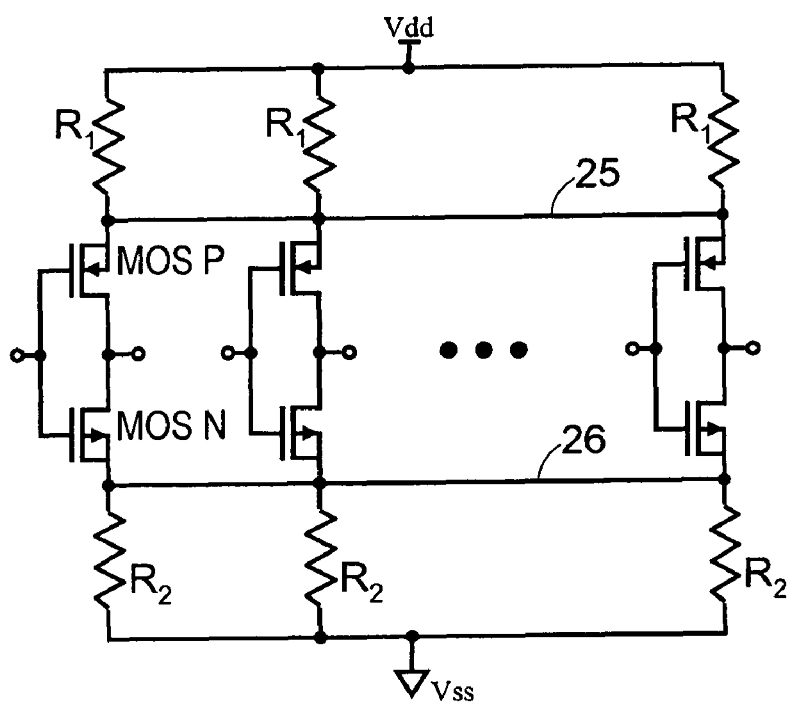

Alternately, as illustrated by the electronic diagram shown on FIG. 8, all or some of the branches 16, 19 of the logic gates are connected together by corresponding metallizations, which puts firstly the resistances $R_1$ and secondly the resistances $R_2$ of the gates in parallel. Each gate is thus connected to the potentials Vdd and Vss connected through all resistances $R_1$ and $R_2$ respectively mounted in parallel. If the logic gates 10 are connected in this manner, the effective access resistances of the MOS transistor sources to the power supply voltages Vdd and Vss are divided by 10. It might be advantageous to reduce the values of these access resistances in some applications.

What is claimed is:

1. An integrated circuit comprising:

a substrate;

a plurality of doped zones formed in the substrate so as to form a plurality of parasitic thyristor structures that each include two parasitic bipolar transistors;

a plurality of first metallizations and a plurality of second metallizations, each of the first metallizations interconnecting two of the doped zones of one of the parasitic thyristor structures and a each of the second metallizations interconnecting another two of the doped zones of one of the parasitic thyristor structures, so as to reduce base resistances of the two bipolar transistors;

a first power supply metallization; and a second power supply metallization, wherein none of the first metallizations is directly connected to the first or second power supply metallization, at least two of the first metallizations are directly connected by a third metallization, none of the second metallizations is directly connected to the first or second power supply metallization, and at least two of the second metallizations are directly connected by a fourth metallization.

2. The integrated circuit according to claim 1, wherein all of the first metallizations are connected to the first power supply metallization entirely through the substrate, and all of the second metallizations are connected to the second power supply metallization entirely through a well that is formed in the substrate.

3. The integrated circuit according to claim 2, wherein the two doped zones interconnected by each of the first metallizations are placed as close as possible to each other.

4. The integrated circuit according to claim 3, further comprising:

a plurality of first and second MOS transistors with different channel types, the first MOS transistor being formed in the substrate and the second MOS transistor being formed in the well that is formed in the substrate, wherein each of the first and second MOS transistors with different channel types form the bipolar transistors of one of the parasitic thyristor structures.

5. The integrated circuit according to claim 1, wherein the two doped zones interconnected by each of the first metallizations are placed as close as possible to each other.

6. The integrated circuit according to claim 1, further comprising:

a plurality of first and second MOS transistors with different channel types, the first MOS transistor being formed in the substrate and the second MOS transistor being formed in a well that is formed in the substrate, wherein each of the first and second MOS transistors with different channel types form the bipolar transistors of one of the parasitic thyristor structures.

7. An integrated circuit comprising:

a substrate;

a plurality of doped zones formed in the substrate so as to form a plurality of parasitic thyristor structures, each of the parasitic thyristor structures including two parasitic bipolar transistors;

a plurality of first metallizations and a plurality of second metallizations, each of the first metallizations interconnecting two of the doped zones of one of the parasitic thyristor structures and each of the second metallizations interconnecting another two of the doped zones of one of the parasitic thyristor structures, so as to reduce base resistances of the two bipolar transistors of the parasitic thyristor structures;

a first power supply metallization; and a second power supply metallization, wherein all of the first metallizations are connected to the first power supply metallization entirely through the substrate, at least two of the first metallizations are directly connected by a third metallization so as to reduce a resistance between the first metallizations and the first power supply metallization, all of the second metallizations are connected to the second power supply metallization entirely through one of the substrate and a well that is formed in the substrate, and at least two of the second metallizations are directly connected by a fourth metallization so as to reduce a resistance between the second metallizations and the second power supply metallization.

8. The integrated circuit according to claim 7, wherein all of the second metallizations are directly connected by the fourth metallization.

9. The integrated circuit according to claim 8, wherein all of the first metallizations are directly connected by the third metallization.

10. The integrated circuit according to claim 8, wherein the two doped zones interconnected by each of the first metallizations are placed as close as possible to each other.

11. The integrated circuit according to claim 7, wherein each of the first metallizations directly connects a first of the doped zones that is a source of a MOS transistor to a second of the doped zones that is adjacent to the first doped zone and oppositely-doped, and each of the second metallizations directly connects a third of the doped zones that is a source of another MOS transistor to a fourth of the doped zones that is adjacent to the third doped zone and oppositely-doped.

12. The integrated circuit according to claim 7, further comprising:

a plurality of pairs of MOS transistors with different channel types, a first MOS transistor of each pair being formed in the substrate and a second MOS transistor of each pair being formed in the well that is formed in the substrate, wherein each of the pairs of MOS transistors form the bipolar transistors of one of the parasitic thyristor structures, and all of the second metallizations are connected to the second power supply metallization entirely through the well that is formed in the substrate.

13. The integrated circuit according to claim 7, further comprising:

a well that is formed in the substrate, wherein some of the doped zones are formed in the well that is formed in the substrate and others of the doped zones are formed in the substrate outside of the well, and all of the second metallizations are connected to the second power supply metallization entirely through the well that is formed in the substrate.

14. The integrated circuit according to claim 13, wherein all of the second metallizations are directly connected by the fourth metallization, and all of the first metallizations are directly connected by the third metallization.

15. An information processing system including a plurality of integrated circuits, at least one of the integrated circuits comprising:

a substrate;

a plurality of doped zones formed in the substrate so as to form a plurality of parasitic thyristor structures that each include two parasitic bipolar transistors;

a plurality of first metallizations and a plurality of second metallizations, each of the first metallizations interconnecting two of the doped zones of one of the parasitic thyristor structures and each of the second metallizations interconnecting another two of the doped zones of one of the parasitic thyristor structures, so as to reduce base resistances of the two bipolar transistors;

a first power supply metallization; and a second power supply metallization, wherein none of the first metallizations is directly connected to the first or second power supply metallization, at least two of the first metallizations are directly connected by a third metallization, none of the second metallizations is directly connected to the first or second power supply metallization, and at least two of the second metallizations are directly connected by a fourth metallization.

16. The information processing system according to claim 15, wherein all of the first metallizations of the one integrated circuit are connected to the first power supply metallization entirely through the substrate, and all of the second metallizations of the one integrated circuit are connected to the second power supply metallization entirely through a well that is formed in the substrate.

17. The information processing system according to claim 16, wherein the two doped zones interconnected by each of the first metallizations of the one integrated circuit are placed as close as possible to each other.

18. The information processing system according to claim 17, wherein the one integrated circuit further comprises:

a plurality of first and second MOS transistors with different channel types, the first MOS transistor being formed in the substrate and the second MOS transistor being formed in the well that is formed in the substrate, wherein each of the first and second MOS transistors with different channel types form the bipolar transistors of one of the parasitic thyristor structures.

19. The information processing system according to claim 15, wherein the two doped zones interconnected by each of the first metallizations of the one integrated circuit are placed as close as possible to each other.

20. The information processing system according to claim 15, wherein the one integrated circuit further comprises:

a plurality of first and second MOS transistors with different channel types, the first MOS transistor being formed in the substrate and the second MOS transistor being formed in a well that is formed in the substrate, wherein each of the first and second MOS transistors with different channel types form the bipolar transistors of one of the parasitic thyristor structures.

* * * * *

UNITED STATES PATENT AND TRADEMARK OFFICE
CERTIFICATE OF CORRECTION

PATENT NO. : 7,868,392 B2
APPLICATION NO. : 11/172609
DATED : January 11, 2011
INVENTOR(S) : Francois Tailliet It is certified that error appears in the above-identified patent and that said Letters Patent is hereby corrected as shown below:

On the Title Page:

In the Abstract, line 6, change "($R_{P-}$, $R_{P-}$)" to --($R_{N-}$, $R_{P-}$)--.

In the Claims:

Claim 1, line 9, before "each", delete "a".

Signed and Sealed this
Eighth Day of March, 2011

David J. Kappos
*Director of the United States Patent and Trademark Office*

UNITED STATES PATENT AND TRADEMARK OFFICE

CERTIFICATE OF CORRECTION

PATENT NO. : 7,868,392 B2
APPLICATION NO. : 11/172609
DATED : January 11, 2011
INVENTOR(S) : Francois Tailliet It is certified that error appears in the above-identified patent and that said Letters Patent is hereby corrected as shown below:

On the Title Page:

In the Abstract, line 6, change “($R_{P-}$, $R_{P-}$)” to --($R_{N-}$, $R_{P-}$)--.

In the Claims:

Column 6, line 1 (Claim 1, line 9) before “each”, delete “a”.

This certificate supersedes the Certificate of Correction issued March 8, 2011.

Signed and Sealed this
Twenty-ninth Day of March, 2011

David J. Kappos
*Director of the United States Patent and Trademark Office*